United States Patent
Cain et al.

[11] Patent Number: 6,114,924
[45] Date of Patent: Sep. 5, 2000

[54] DUAL CORE RF DIRECTIONAL COUPLER

[75] Inventors: Steven L. Cain, Lawrenceville; Michael G. Ellis, Alpharetta, both of Ga.

[73] Assignee: Antec Corporation, Duluth, Ga.

[21] Appl. No.: 09/064,400

[22] Filed: Apr. 22, 1998

Related U.S. Application Data

[60] Provisional application No. 60/069,183, Dec. 11, 1997.

[51] Int. Cl.$^7$ .................................................. H03H 7/48
[52] U.S. Cl. ............................ 333/112; 333/119; 336/221
[58] Field of Search ...................... 333/112, 119, 333/131, 25; 336/172, 180, 182, 212, 221, 220

[56] References Cited

U.S. PATENT DOCUMENTS

| | | | |
|---|---|---|---|
| 3,783,415 | 1/1974 | Koskinen | 333/25 |
| 4,467,293 | 8/1984 | Apel | 333/112 |
| 5,177,460 | 1/1993 | Dhyanchand et al. | 336/212 X |
| 5,705,961 | 1/1998 | Yee | 333/131 |
| 5,719,546 | 2/1998 | Ito . | |

OTHER PUBLICATIONS

Ellis; *RF Directional Couplers*; RF Couplers magazine; Feb. 1997.

*Primary Examiner*—Paul Gensler

[57] ABSTRACT

An RF directional coupler includes dual binocular ferrite cores. The dual cores are positioned back-to-back, such that the adjacent surfaces of each core contact each other. Each core has two generally cylindrical holes that extend through the core. Each hole preferably extends longitudinally through each respective core and is parallel to each other hole. One core is called the "main core" and the other core is called the "return core". Wire windings enter the coupler from the printed circuit board from the bottom of the coupler. A winding enters one hole in the main core and exits the hole on the top of the coupler. The winding then enters the corresponding hole in the return core from the top of the coupler. The winding then proceeds downwardly and exits the hole in the return core at the bottom of the coupler. After exiting the return core, the winding may then again enter the hole in the main core or may connected to a connection port on the printed circuit board. In this manner, the windings are not required to exit the main core and then return to the main core by looping around the outside of the main core. Instead, the windings return to the main core through holes in the return core.

4 Claims, 2 Drawing Sheets

DUAL CORE RF DIRECTIONAL COUPLER

CROSS-REFERENCE TO RELATED APPLICATION

The present application claims the benefit of priority of U.S. Provisional Patent Application Ser. No. 60/069,183, filed Dec. 11, 1997, and entitled "Hi-Coupling RF Coupler".

TECHNICAL FIELD

The present invention relates to an RF directional coupler for use in electronic equipment for communications systems, particularly for use in amplifiers of cable television communications systems.

BACKGROUND OF THE INVENTION

Typical cable television communications systems include four main elements, a headend, a trunk system, a distribution system consisting of feeder cables bridged from the trunk system, and subscriber drops fed from broadband signal taps in the distribution system.

The headend, which is the central originating point of all signals carried on the network, receives signals that are broadcasted, transmitted by cable, or transmitted by satellites and transmits these signals as a broadband signal to numerous distribution nodes via trunk cables. Each distribution node, in turn, distributes the signals along with power, via feeder cables, with each feeder cable terminating at a termination block. Each feeder cable has numerous amplifiers and signal taps inserted between the distribution node and the termination block. Typically, an amplifier is provided every half mile, either on a utility pole or in a pedestal on the ground. Each amplifier provides amplification of the broadband signal and each broadband signal tap draws a portion of the amplified broadband signal and power for use by a subscriber.

There are typically three types of signals in a cable television communications system: a "power signal", a "forward signal" from the headend to the subscriber, and a "reverse signal" from the subscriber to the headend. Rather than rely on power from a subscriber circuit, CATV operators typically prefer to supply a power signal that provides electrical power through the same coaxial cable that provides the broadband signal. The forward signal provides the broadband signal containing the audio and video signals for the various cable television channels. The reverse signal is typically a digital signal that allows the subscriber to communicate with the headend, typically to order services in connection with interactive television services. The forward and reverse signals are amplified by the amplifiers at various locations along the feeder cables.

Within each amplifier, there are typically a number of RF directional couplers that operate to split the RF energy in the forward and reverse signals into two portions. Within each coupler, a small portion of the signal is extracted from the input signal and the remaining large portion of the signal is passed through the coupler. The extracted portion of the signal is typically provided to a test point, which allows a service technician to inspect signal levels without interrupting the main signal.

Preferably, each RF coupler should provide impedance matching and high return loss. A prior RF coupler is shown in FIGS. 1A and 1B. The coupler, generally shown at 10, includes a core 12 having two holes 14 therein. The core 12 is typically a ferrite core and is called a dual hole core, or a "binocular" core, because of its shape. Wire windings 16 enter a hole from one side of the core and exit the hole from the opposite side of the core, which requires that the winding return to the hole from outside the core to begin another turn through the hole. Therefore, wire windings pass through the holes and then return to the same hole by looping around the outside of the core.

In FIGS. 1A and 1B, it is seen how the wire windings on the outside of the core are spread out around the periphery of the core, rather than staying closely bunched together. The spacing of the windings outside the core may be due to the lack of a confined path for the windings outside the core or to the need to manually tune the coupler, in which service personnel adjust the spacing of the windings outside the core until a desired return loss and impedance match is obtained. Having the windings located outside the core and spread out outside the core is disadvantageous because it decreases the magnetic coupling of the windings and therefore decreases the performance of the coupler.

Accordingly, there is a need for an RF coupler having high return loss and excellent impedance matching that does not have windings that exit a hole in the core and return to the hole from outside the core.

SUMMARY OF THE INVENTION

The present invention is an RF directional coupler that includes dual binocular ferrite cores. The dual cores are positioned back-to-back, such that the adjacent surfaces of each core contact each other. Each core has two generally cylindrical holes that extend through the core. Each hole preferably extends longitudinally through each respective core and is parallel to each other hole. One core is called the "main core" and the other core is called the "return core". It will be understood that the present invention can also be implemented with a single core of suitable shape having four holes, rather than as two separate cores having two holes each.

Wire windings enter the coupler from the printed circuit board from the bottom of the coupler. A winding enters one hole in the main core and exits the hole on the top of the coupler. The winding then enters the corresponding hole in the return core from the top of the coupler. The winding then proceeds downwardly and exits the hole in the return core at the bottom of the coupler. After exiting the return core, the winding may then again enter the hole in the main core or may be connected to a connection port on the printed circuit board.

Similarly, another winding enters the other hole in the main core and returns through the other hole in the return core. In this manner, the windings are not required to exit the main core and then return to the main core by looping around the outside of the main core. Instead, the windings return to the main core through holes in the return core.

DETAILED DESCRIPTION

Although the present invention is disclosed herein for use in an amplifier in a cable television communications system, those skilled in the art will realize that the present invention is not limited to such use. To the contrary, the present invention can be utilized in many other areas of technology without departing from the spirit and teachings of the present invention.

Figure 2:
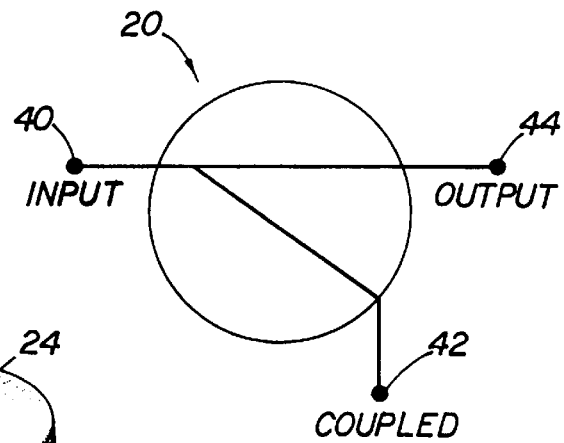
FIG. 2 is a symbolic representation of the RF directional coupler of the present invention.

Referring now in detail to the drawing figures, wherein like reference numerals represent like parts throughout the several views, an RF coupler in accordance with the present invention is shown. In general, the coupler extracts a predetermined amount of energy from the signal input to the coupler and passes the remainder of the signal through the coupler. As shown in the symbolic representation of the coupler in FIG. 2, the signal is input to the coupler 20 at the input port 40. The extracted portion of the signal is provided to the coupled port 42, and the remainder of the signal is provided to the output port 44. In accordance with the preferred embodiment of the present invention, the extracted portion of the signal that is provided to the coupled port 42 is 16 dB down from the level of the signal provided to the input port 40.

Figure 3:
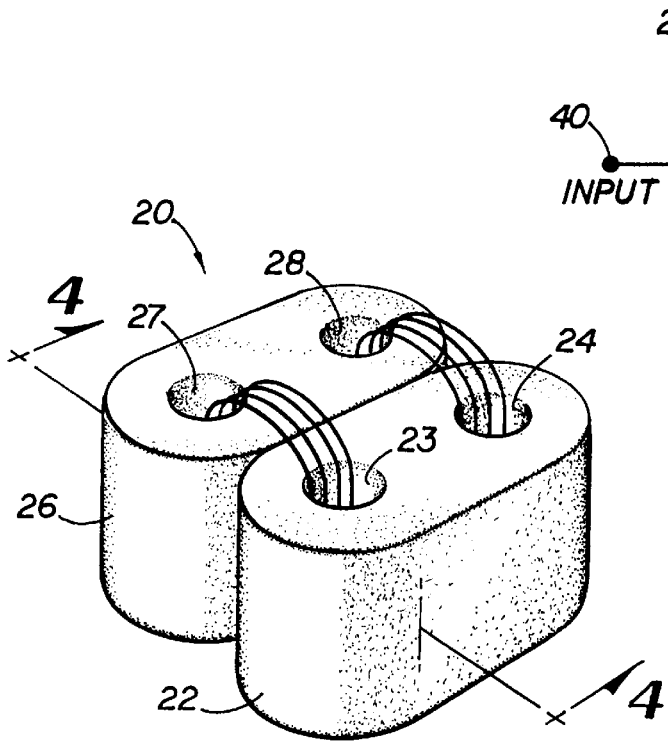
FIG. 3 is a front perspective view of an RF directional coupler of the present invention.
Figure 4:
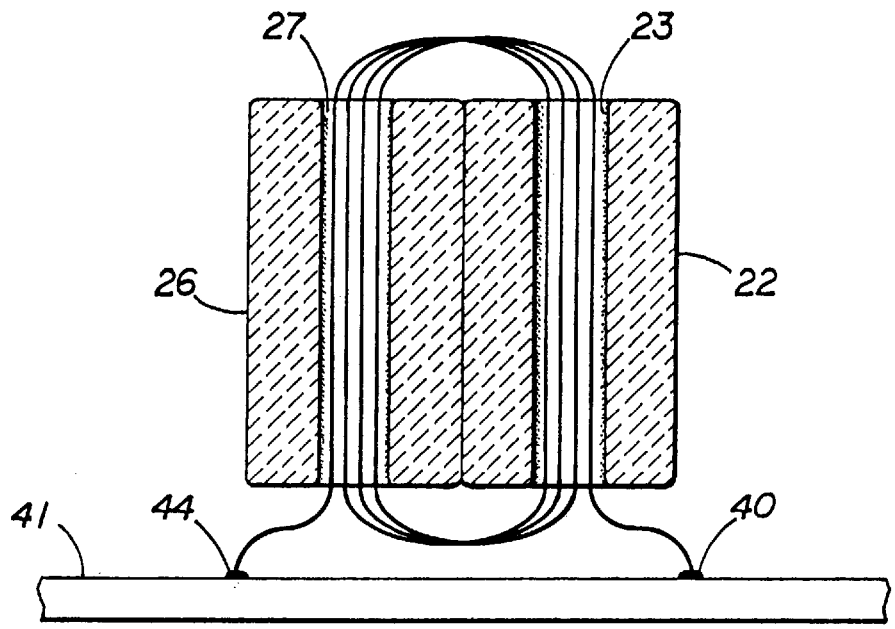
FIG. 4 is a cross-sectional view of the RF directional coupler of the present invention taken along lines 4—4 of FIG. 3.

As shown in FIGS. 3 and 4, the coupler 20 of the present invention preferably includes dual binocular ferrite cores 22 and 26. The cores 22 and 26 are preferably positioned back-to-back, such that the adjacent surfaces of each core contact each other. Each core has two generally cylindrical holes that extend through the core. Specifically, core 22 includes holes 23 and 24 and core 26 includes holes 27 and 28. Each hole preferably extends longitudinally through each respective core and is parallel to each other hole. For purposes of this description, core 22 shall be called the "main core" and core 26 shall be called the "return core". Holes 23 and 24 in the main core 22 shall be called "main holes" and holes 27 and 28 in the return core 26 shall be called "return holes". It will be understood that the present invention can also be implemented with a single core of suitable shape having four holes, rather than as two separate cores having two holes each.

As best seen in FIG. 4, the coupler of the present invention is shown mounted on a printed circuit board 41. The wire windings enter the coupler from the printed circuit board from the bottom of the coupler. It will be understood that several different windings can pass through the coupler, but for purposes of this description, only one winding will be described.

The winding enters main hole 23 from the bottom of main core 22 and exits main hole 23 on the top of the coupler. The winding then enters the corresponding hole of the return core, i.e., return hole 27 of return core 26, from the top of the coupler. The winding then proceeds downwardly and exits return hole 27 at the bottom of the coupler. After exiting return hole 27, the winding may be then again enter main hole 23 of main core 22 from the bottom of the coupler or may connected to a connection port on the printed circuit board.

Similarly, another winding enters main hole 24 of main core 22 and exits main hole 24 on the top of the coupler. The winding then enters the corresponding hole of the return core, i.e., return hole 28 of return core 26. The winding then proceeds downwardly and exits return hole 28 at the bottom of the coupler. After exiting return hole 28, the winding may then again enter main hole 24 of main core 22 from the bottom of the coupler or may be connected to a connection port on the printed circuit board.

In this manner, the windings are not required to exit the main hole and then return to the main hole by looping around the outside of the main core. Instead, the windings return to the entrance of the main hole through the return hole of the return core.

Figure 5:
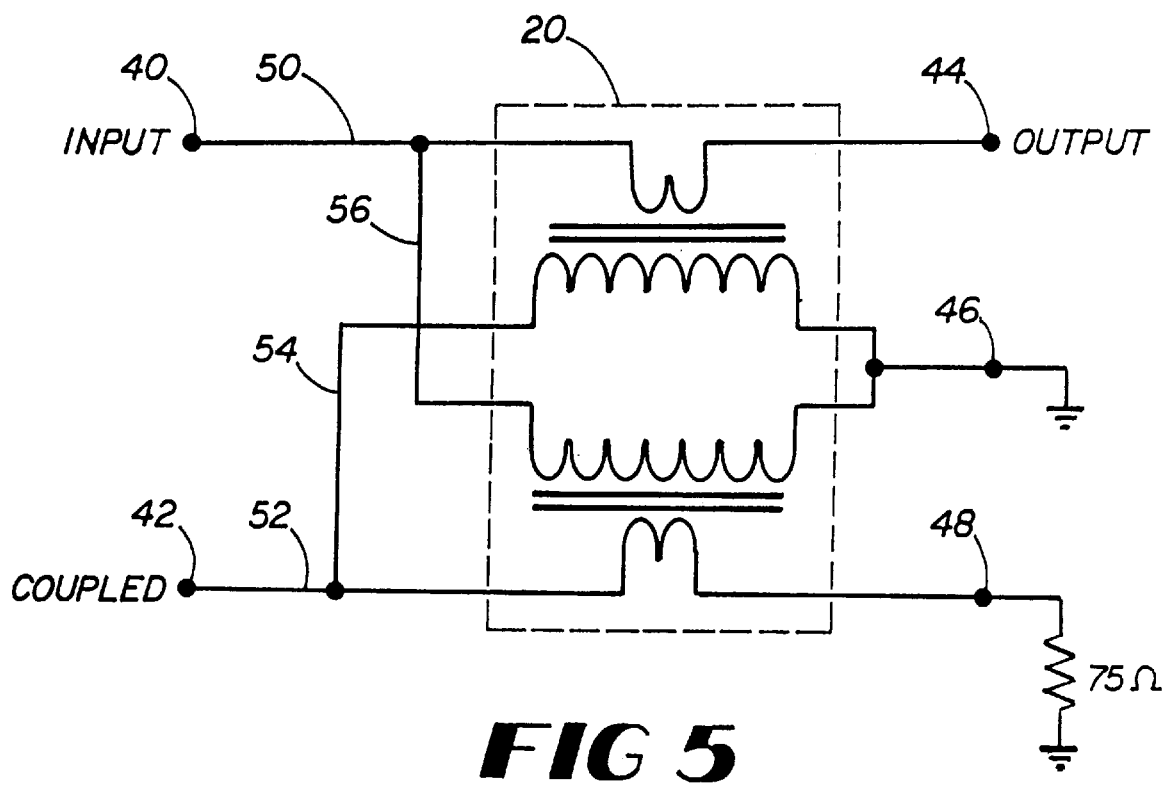
FIG. 5 is a circuit schematic diagram of the RF coupler of the present invention.

The coupler preferably has two connections on one edge and three connections on the other edge, as best shown in the circuit schematic diagram of FIG. 5, which is a schematic diagram of a preferred embodiment of the coupler of the present invention. A first winding 50 enters the coupler 20 from input port 40 on the printed circuit board. Winding 50 makes one full turn though main hole 23 and return hole 27 and is connected to the output port 44 on the circuit board. A "full turn" is defined herein as a winding that passes through the length of a hole in the main core, and then passes through the length of the corresponding return hole in the return core.

A second winding 52 enters the coupler from the coupled port 42 on the circuit board. Winding 52 makes one full turn though main hole 24 and return hole 28 of the coupler and then exits the coupler. Winding 52 is then connected to the circuit board at 48, where it is connected to a 75 Ω resistor and grounded. A third winding 54 is connected to winding 52 before it enters the coupler. Winding 54 makes six full turns through main hole 23 and return hole 27 of the coupler and then exits the coupler. A fourth winding 56 is connected to winding 50 before it enters the coupler and makes six full turns through main hole 24 and return hole 28 of the coupler. Winding 56 then exits the coupler where it is connected to winding 54, connected to the circuit board at 46, and 10 then grounded.

As stated above, the present invention may be used in an amplifier in a cable television communications system such that the input signal is a broadband signal carrying programming information and other information to and from subscribers. In the described exemplary embodiment, the RF coupler of the present invention extracts a portion of the signal provided to the input port 40 that is approximately 16 dB down from the level of the input signal. The extracted portion of the signal is provided to the coupled port 42, and the remainder of the signal is provided to the output port 44. The extracted portion of the input signal is preferably provided to a test point to allow service personnel to test the input signal without interrupting the transmission of the remainder of the input signal to downstream subscribers.

It will be understood by those skilled in the art that although the described embodiment uses a 6:1 turn ratio between windings 54 and 50 and between windings 56 and 52 to achieve the desired −16 dB extracted signal level, many different turn ratios can be used to achieve any other desired extracted signal level. For example, a turn ratio of 3:1 would yield an extracted portion of the signal that is approximately 10 dB down from the level of the input signal. Therefore, the present invention should not be construed to be limited to the exemplary description herein.

Figure 1A:
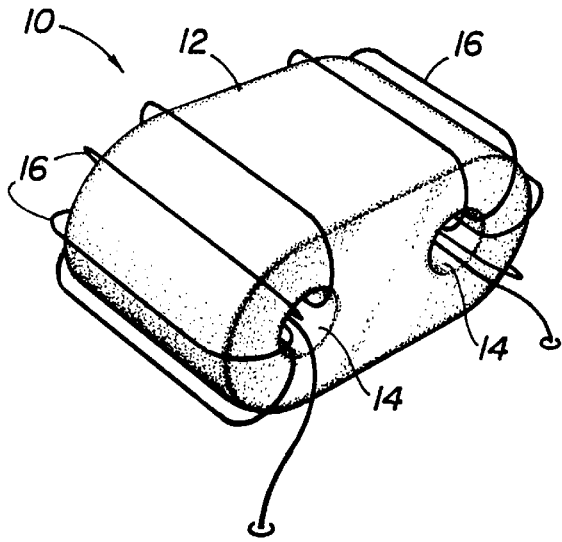
FIGS. 1A and 1B are a front perspective view and a side view, respectively, of a prior RF directional coupler.

There are at least several advantages of the coupler of the present invention as described herein. One advantage is that the coupler of the present invention provides a better return loss than the prior coupler shown in FIGS. 1A and 1B. As is well known in the art, the return loss is a measure of the percentage of RF power that is reflected from a termination point back down the coaxial cable. The return loss is also a measure of the impedance matching of a device to the input line. An impedance mismatch between the coupler and the connecting circuits will cause a reflected signal. Reflected signals traveling along the coaxial cable are undesirable and result in ghosting problems on television receivers.

A zero dB return loss means that all of the input signal is reflected back down the coaxial cable from the mismatch point. The coupler of the present invention has a return loss of approximately 30 dB down from the input signal level at a frequency of 5 MHz. This is approximately a 10 dB improvement in return loss over the prior coupler design shown in FIGS. 1A and 1B. Although the coupler of the present invention is preferably operated at frequencies between 5 and 42 MHz, the coupler can be effectively operated at frequencies up to 200 MHz.

Another important advantage of the present invention is that by using the return core for winding returns, coupling is provided on both passes of the windings through each hole of each core. Still another advantage of the present invention is that the windings are kept closely bunched together because their movement is prevented by the relatively small holes in each core. The curvature of each hole forces windings toward each other. With more compact windings, there is less component variation than with existing couplers. The need to tune for component variation is therefore greatly minimized.

Figure 1B:
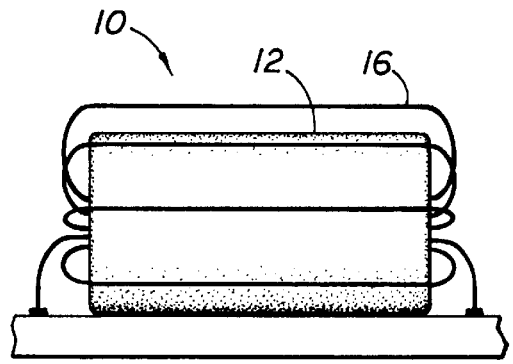

Additionally, the coupler of the present invention has all inputs and outputs extending from the bottom surface of the coupler, unlike prior single core couplers which had inputs and outputs on opposite sides of the coupler, as shown in FIG. 1B. By having inputs and outputs on the same side, i.e., the bottom side, of the coupler, the length of the leads connecting the coupler to the circuit board is reduced. The shorter leads reduce parasitic lead inductance, thereby giving the coupler better match at higher frequencies.

While the invention has been disclosed in preferred forms, it will be apparent to those skilled in the art that many modifications, additions, and deletions can be made without departing from the spirit and scope of the invention as set forth in the following claims.

What is claimed is:

1. A directional coupler for use in a communications system, comprising:
    a main core having a first and second hole extending therethrough;
    a return core having a first and second hole extending therethrough;
    wherein a first winding passes through a first hole in the main core and then passes through a first hole in the return core; and
    wherein a second winding passes through a second hole in the main core and then passes through a second hole in the return core;
    wherein the coupler has an input port to which an input signal is provided, a coupled port to which an extracted portion of the input signal is provided, and an output port to which the remainder of the input signal is provided, and wherein the input port, coupled port, and output port are provided on the bottom of the coupler.

2. A directional coupler for use in a communications system, comprising:
    a main core having a first and second hole extending therethrough;
    a return core having a first and second hole extending therethrough;
    wherein a first winding passes through a first hole in the main core and then passes through a first hole in the return core; and
    wherein a second winding passes through a second hole in the main core and then passes through a second hole in the return core;
    wherein said main core and said return core are separately formed and contact each other.

3. A directional coupler for use in a communications system, comprising:
    a main core having a first and second hole extending therethrough;
    a return core having a first and second hole extending therethrough;
    wherein a first winding passes through a first hole in the main core and then passes through a first hole in the return core; and
    wherein a second winding passes through a second hole in the main core and then passes through a second hole in the return core;
    wherein each said core is a binocular core.

4. A directional coupler for use in a communications system, comprising:
    a main core having a first and second hole extending therethrough;
    a return core having a first and second hole extending therethrough;
    wherein a first winding passes through a first hole in the main core and then passes through a first hole in the return core; and
    wherein a second winding passes through a second hole in the main core and then passes through a second hole in the return core;
    wherein the coupler has an input port to which an input signal is provided, a coupled port to which an extracted portion of the input signal is provided, and an output port to which the remainder of the input signal is provided, and wherein the input port, coupled port, and output port are provided on the same side of the coupler.

* * * * *